United States Patent
Lozes et al.

(10) Patent No.: US 7,498,591 B2
(45) Date of Patent: *Mar. 3, 2009

(54) CRITICAL DIMENSION EFFECTS CORRECTION IN RASTER PATTERN GENERATOR

(75) Inventors: Richard L. Lozes, Pleasanton, CA (US); Benyamin Buller, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 435 days.

This patent is subject to a terminal disclaimer.

(21) Appl. No.: 11/241,792

(22) Filed: Sep. 30, 2005

(65) Prior Publication Data

US 2007/0085030 A1    Apr. 19, 2007

(51) Int. Cl.
*G21G 5/00* (2006.01)
*H01J 37/302* (2006.01)

(52) U.S. Cl. ............... 250/492.22; 250/491.1; 250/492.3; 430/30; 430/296; 430/942

(58) Field of Classification Search ............ 250/396 R, 250/398, 491.1, 492.2, 492.22, 492.23, 492.3; 430/30, 296, 942
See application file for complete search history.

(56) References Cited

U.S. PATENT DOCUMENTS

| | | | |
|---|---|---|---|
| 5,051,598 A | | 9/1991 | Ashton et al. |
| 5,241,185 A | * | 8/1993 | Meiri et al. ............... 250/492.2 |
| 5,393,634 A | * | 2/1995 | Maker et al. ................... 430/1 |
| 5,847,959 A | * | 12/1998 | Veneklasen et al. ......... 700/121 |
| 5,863,682 A | * | 1/1999 | Abe et al. ...................... 430/30 |
| 6,556,702 B1 | * | 4/2003 | Rishton et al. ............... 382/144 |
| 6,720,565 B2 | * | 4/2004 | Innes et al. ............. 250/492.22 |
| 6,783,905 B2 | * | 8/2004 | Yang ........................... 430/30 |
| 7,148,496 B2 | * | 12/2006 | Menon et al. .......... 250/492.22 |
| 2002/0148978 A1 | * | 10/2002 | Innes et al. ............. 250/492.22 |
| 2003/0151003 A1 | | 8/2003 | Ogasawara |
| 2003/0152850 A1 | | 8/2003 | Kamijo |
| 2005/0221204 A1 | * | 10/2005 | Kimura ........................... 430/5 |
| 2005/0224725 A1 | * | 10/2005 | Menon et al. .......... 250/492.22 |
| 2005/0273753 A1 | * | 12/2005 | Sezginer ....................... 716/21 |
| 2005/0287451 A1 | * | 12/2005 | Hudek et al. ................... 430/30 |
| 2007/0085030 A1 | * | 4/2007 | Lozes et al. ............... 250/492.1 |
| 2007/0085031 A1 | * | 4/2007 | Lozes et al. ............... 250/492.1 |
| 2008/0067446 A1 | * | 3/2008 | Belic et al. ............. 250/492.22 |

OTHER PUBLICATIONS

PCT International Search Report dated Aug. 28, 2007.

* cited by examiner

*Primary Examiner*—Bernard E Souw
(74) *Attorney, Agent, or Firm*—Patterson & Sheridan LLP

(57) ABSTRACT

A method for generating a flash. The method includes computing dose correction multipliers taking into account fogging scattering effects, backscattering effects and fast secondary scattering effects; and using the dose correction multipliers to generate the flash.

17 Claims, 4 Drawing Sheets

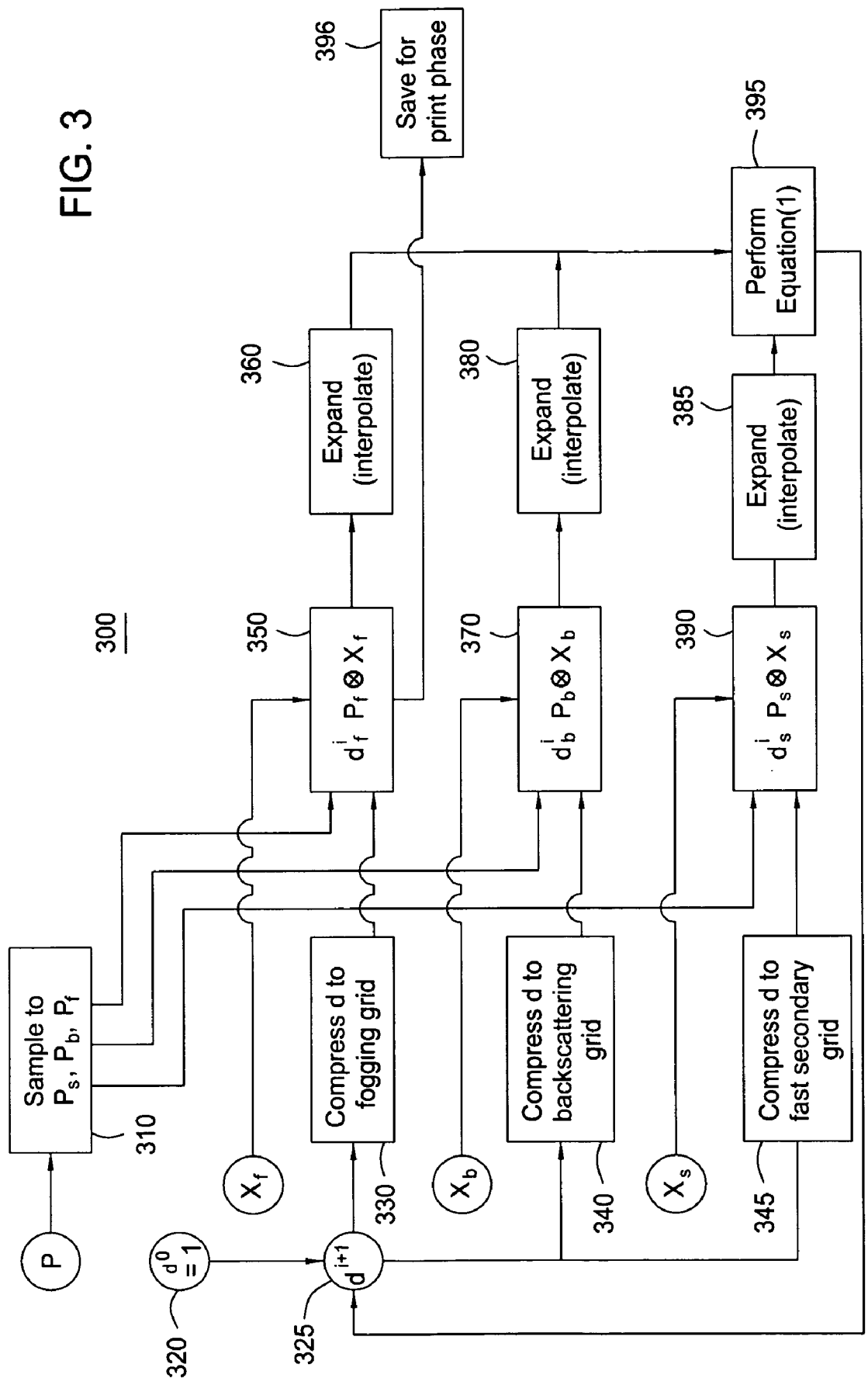

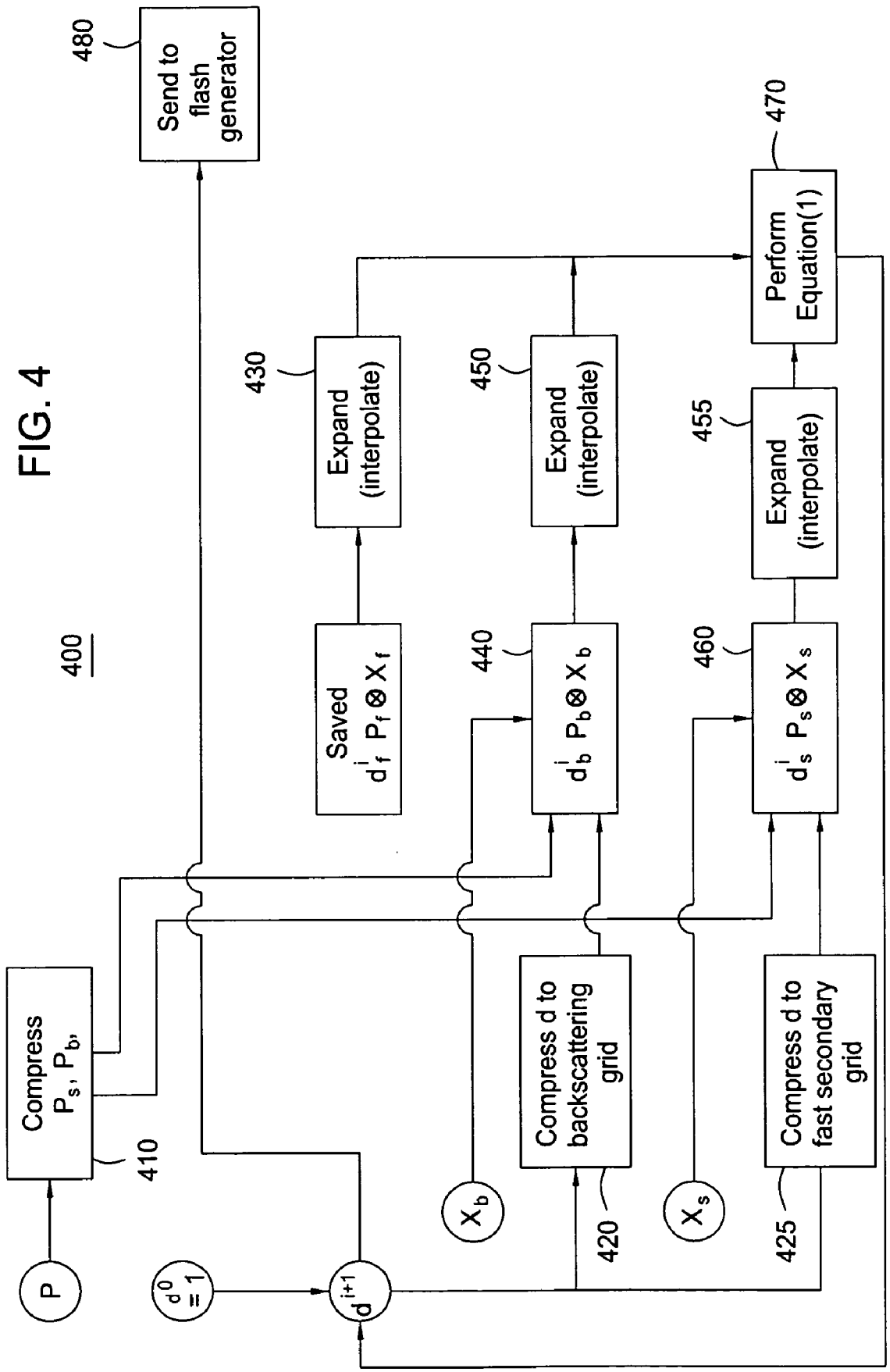

CRITICAL DIMENSION EFFECTS CORRECTION IN RASTER PATTERN GENERATOR

BACKGROUND OF THE INVENTION

1. Field of the Invention

Embodiments of the present invention generally relate to pattern generation systems and methods used by such systems to form patterns on substrates, and more particularly, to an electron beam pattern generation system.

2. Description of the Related Art

Any effect on the exposure of a point in an imaged pattern by the exposure of any neighboring point may be called a proximity effect. For example, limited resolution of the electron optical exposure or inherent resist resolution, electron scattering in the resist layer and electron backscattering from the substrate on which the resist layer lies may cause a blurring of the exposure dose distribution delivered to a specific point. As a result, a portion of the exposure dose designed to be delivered to a specific point is in fact delivered to neighboring points. In addition, exposure of the resist layer at a specific point may result in localized heating of the resist that can diffuse outward to neighboring points. The result is modified resist sensitivity at those neighboring, proximate points. These effects may also be referred to as critical dimension effects.

Thermal expansion of the substrate on which the resist is formed is another localized heating effect that may result in feature placement errors at neighboring points through non-uniform thermal expansion of the substrate. These thermal expansion errors may also be referred to as placement effects.

These proximity effects may result in an exposure dose error, real or effective, at specific points. Critical dimension effects and placement effects may cause real exposure dose errors by altering the location of the point where an electron influences the resist. Resist heating may result in an effective exposure dose error by altering the sensitivity of the resist to electrons.

Where critical dimension effects depend only on the total exposure dose delivered to neighboring sites, resist heating effects and placement effects may also be influenced by the rate and time sequence of exposure dose delivery. Thus, by a variety of mechanisms, proximity effects may result in unwanted variations in the size, shape and or location of lithographic features.

The correction of these errors is an important aspect of electron beam lithography, particularly in view of the trend to smaller geometries with increasingly complex patterns requiring greater precision and accuracy. A need, therefore, exists in the art for an improved method and system for minimizing, if not eliminating, critical dimension effects and placement effects in connection with generating a flash.

SUMMARY OF THE INVENTION

Embodiments of the invention are generally directed to a method for generating a flash. The method includes computing a displacement vector to resist charging. The displacement vector is defined as $\vec{\delta}_c = dP \otimes \vec{K}$, where $\vec{\delta}_c$ represents the displacement vector, d represents dose correction multipliers, P represents pattern exposure data, $\otimes$ represents a mathematical convolution operation, and $\vec{K}$ represents a Poisson kernel converted to a spatial domain. The method further includes using the displacement vector to modify the positioning of the flash.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3 illustrates a flow diagram of a method for computing the fogging scattering portion of the dose correction multipliers in accordance with one or more embodiments of the invention.

FIG. 4 illustrates a flow diagram of a method for computing dose correction multipliers in accordance with one or more embodiments of the invention.

DETAILED DESCRIPTION

Figure 1:
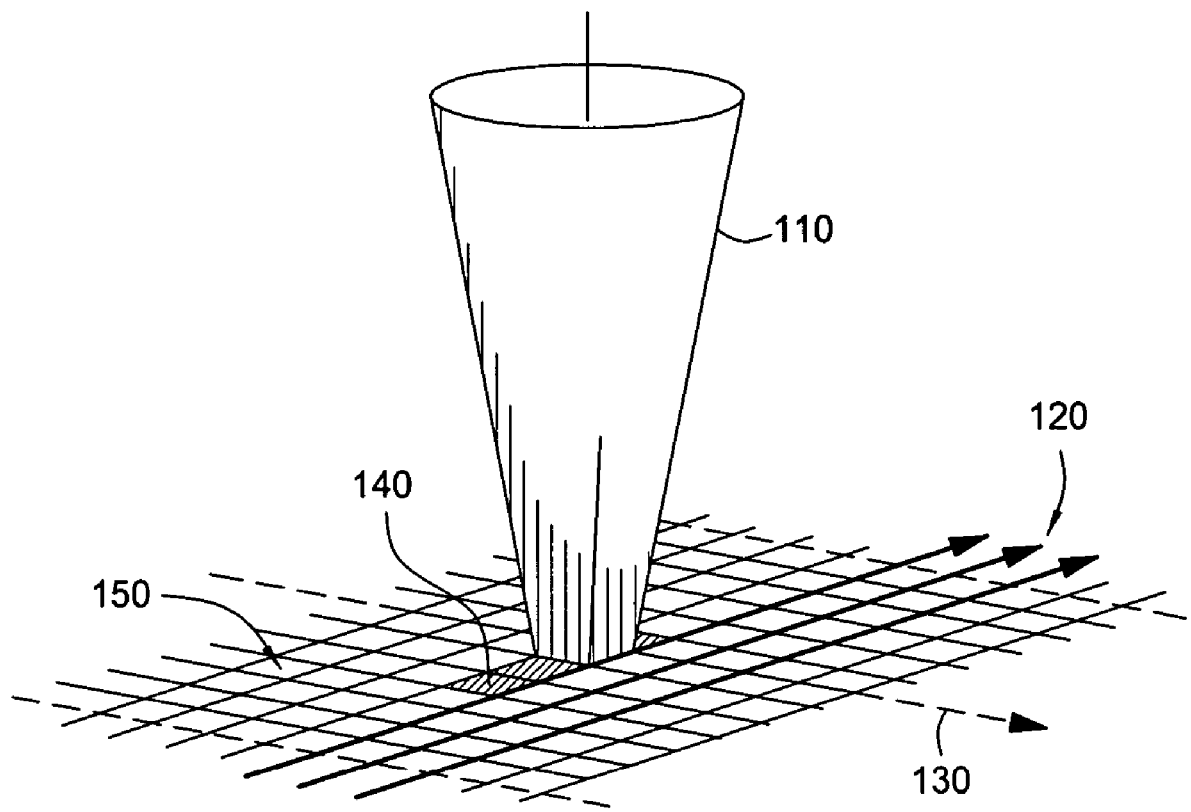
FIG. 1 illustrates a simplified representation of a raster scan writing strategy.

The run-time proximity corrections disclosed herein employ a raster scan writing strategy and a rasterized pattern data representation in an electron beam pattern generating system. FIG. 1 illustrates a simplified representation of a raster scan writing strategy. One or more electron beams 110 are scanned periodically 120 in a first direction, while stage motion 130 in a second, orthogonal direction provides for exposure of each pixel 140. Each time, beam 110 is scanned in the first direction exposing one or more rows of pixels 140. To support this writing strategy, data is organized as a regular array of exposure data. Pixels are typically in the range of approximately 0.05 to 0.2 μm in diameter to write features having a size in the range of approximately 0.05 to 2.0 μm. Exposure data for each pixel 140 consists of one exposure level $P_{ij}$, where i and j are indices for grid 150.

Critical dimension or proximity effects discussed herein include fogging scattering effects, backscattering effects, scattering effects of fast secondary electrons, and relative resist sensitivity. The various scattering effects are at varying length scales, i.e., the fogging scattering is at about 10 mm, the backscattering is at about 10 μm and the scattering of fast secondary electrons is at about 100 nm to about 1000 nm. As such, the various scattering effects range over five orders of magnitude, i.e., from about 100 nm to about 10 mm. Relative resist sensitivity will be described in the paragraphs below.

Corrections of these various critical dimension effects may involve calculations to determine what dose modification, if any, will be applied to each pixel during writing. Some calculations may involve convolving various functions with one another to result in run-time corrections in the manner described in the following paragraphs. Some calculations may use convolution kernels to generate corrections. Embodiments of the invention may be implemented in a rasterizer (not shown). Critical dimension effects using embodiments of the invention may be corrected at run time or at data preparation.

Figure 2:
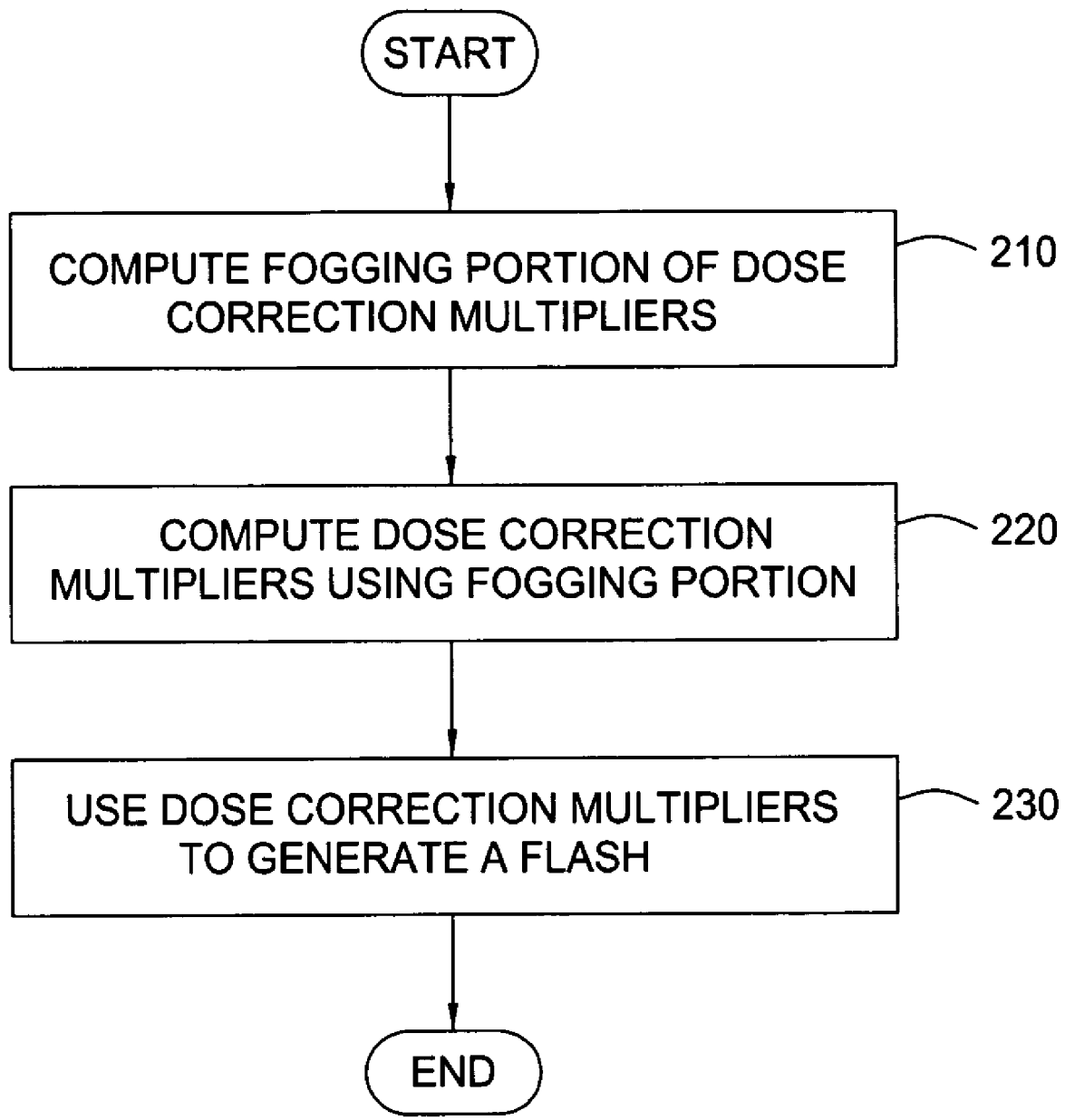
FIG. 2 is a method for printing a pattern in accordance with one or more embodiments of the invention.

FIG. 2 is a method 200 for printing a pattern in accordance with one or more embodiments of the invention. At step 210, the fogging scattering portion of the dose correction multipliers are computed. In one embodiment, the fogging scattering portion of the dose correction multipliers are computed prior to printing.

FIG. 3 illustrates a flow diagram of a method 300 for computing the fogging scattering portion of the dose correction multipliers in accordance with one or more embodiments of the invention. At step 310, the pattern is sampled to grids suitable for the various critical dimension scattering effects. As an example, for the fogging scattering effects, the pattern may be sampled to a grid having a cell size of about 1 mm. For the backscattering effects, the pattern may be sampled to a grid having a cell size of about 1 μm. For the scattering effects of fast secondary electrons, the pattern may be sampled to a grid having a cell size of about 50 to about 200 nm. In one embodiment, the pattern may be quasi-random sampled. In another embodiment, the sample may be about 1% to about 10% of the pattern.

At step 320, the dose correction multipliers are initialized to 1. At step 330, the dose correction multipliers are compressed to the grid suitable for the fogging scattering effects, which has the same size as the grid described in step 310. Likewise, at step 340, the dose correction multipliers are compressed to the grid suitable for the backscattering effects, which has the same size as the grid described in step 310. Likewise, at step 345, the dose correction multipliers are compressed to the grid suitable for the scattering effects of fast secondary electrons, which has the same size as the grid described in step 310. In this manner, the dose correction multipliers and the pattern samples are at the same grid size.

At step 350, the compressed dose correction multipliers and the pattern sample for the fogging scattering effects are multiplied point by point and convolved with $X_f$ to generate the fogging scattering portion (or term) of the compressed dose correction multipliers. $X_f$ is defined as $$X_f = \sum^{fogging} a_i G(\sigma_i),$$

where $a_i$ represents weights of respective Gaussians G of widths $\sigma_i$. $X_f$ is thus that portion of the electron scattering point spread function due to fogging. The fogging scattering portion of the compressed dose correction multipliers is calculated over the entire mask. At step 360, the fogging scattering portion of the compressed dose correction multipliers is expanded to a common scale grid. In one embodiment, the common scale grid has a cell size of about 50 to about 200 nm. The expansion operation is performed using an interpolation algorithm, such as linear interpolation, quadratic interpolation or any other interpolation algorithm commonly known by persons of ordinary skill in the art.

At step 395, the entire dose correction multipliers are computed according to the following equation:

$$d'=Ad/\Theta\{A_k d+2(d_s P_s \otimes X_s)+2(d_b P_b \otimes X_b)+2(d_f P_f \otimes X_f)\} \text{(Equation 1)},$$

where A represents the sum of all coefficients in the Gaussian representation of the point spread function, d represents the dose correction multipliers, $A_k$ represents the weight of that proportion of the energy deposition that does not scatter by fast secondary, backscatter, or fogging effects, $d_s P_s \otimes X_s$ represents the fast secondary scaterring portion of the dose correction multipliers computed at step 385-390, $d_b P_b \otimes X_b$ represents the backscattering portion of the dose correction multipliers computed at steps 370-380, $d_f P_h \otimes X_f$ represents the fogging scattering portion of the dose correction multipliers computed at steps 350-360 and Θ represents correction for relative resist sensitivity, which will be described in the paragraphs below.

At step 390, the dose correction multipliers and the pattern sample for the scattering effects of fast secondary electrons are multiplied point by point and convolved with $X_s$ to generate the fast secondary scattering portion (or term) of the compressed dose correction multipliers. $X_s$ is defined as $$X_s = \sum^{fast\text{-}secondary} a_i G(\sigma_i).$$

In one embodiment, the scattering portion corresponding to the scattering effects of fast secondary electrons of the compressed dose correction multipliers is calculated over a sample of the mask. At step 385, the scattering portion corresponding to the scattering effects of fast secondary electrons of the compressed dose correction multipliers is expanded to a common scale grid. The expansion operation may be performed using an interpolation algorithm, such as linear interpolation, quadratic interpolation or any other interpolation algorithm commonly known by persons of ordinary skill in the art.

At step 395, the entire dose correction multipliers are computed according to the following equation:

$$d'=Ad/\Theta\{A_k d+2(d_s P_s \otimes X_s)+2(d_b P_b \otimes X_b)+2(d_f P_f \otimes X_f)\} \text{(Equation 1)},$$

where A represents the sum of all coefficients in the Gaussian representation of the point spread function, d represents the dose correction multipliers, $A_k$ represents the weight of that proportion of the energy deposition that does not scatter by fast secondary electron, backscatter, or fogging effects, $d_s P_s \otimes X_s$ represents the scattering of fast secondary electrons portion of the dose correction multipliers computed at step 385-390, $d_b P_b \otimes X_b$ represents the backscattering portion of the dose correction multipliers computed at steps 370-380, $d_f P_h \otimes X_f$ represents the fogging scattering portion of the dose correction multipliers computed at steps 350-360 and Θ represents correction for relative resist sensitivity, which will be described in the paragraphs below.

Steps 330 through 395 are then repeated until the dose correction multipliers computed at step 395 converge. Step 325 illustrates that processing is repeated for the next iteration. As such, i represents an iteration index for the dose correction multipliers.

At the point of convergence, at step 396, the fogging scattering portion of the compressed dose correction multipliers computed at step 350 is saved or frozen for future use during the printing phase, which will be described with reference to FIG. 4. Steps 330 through 395 may be repeated or iterated about 3 or 4 times. In one embodiment, at step 396, the fogging scattering portion of the compressed dose correction multipliers that has been expanded to a common scale grid at step 360 is saved or frozen, rather than the fogging scattering portion of the compressed dose correction multipliers computed at step 350.

Referring back to FIG. 2, at step 220, the frozen fogging portion of the dose correction multipliers is used to compute the rest of the dose correction multipliers. FIG. 4 illustrates a flow diagram of a method 400 for computing dose correction multipliers in accordance with one or more embodiments of the invention. At step 410, the pattern is compressed to grids configured to take into account the backscattering effects and the scattering effects Of fast secondary electrons. At step 420, the dose correction multipliers are compressed to a grid configured for the backscattering effects. At step 425, the dose correction multipliers are compressed to a grid configured for the scattering effects of fast secondary electrons.

At step 430, the saved or frozen fogging portion of the compressed dose correction multipliers is expanded using to a common scale grid. In one embodiment, the common scale grid has a cell size of about 50 to about 200 nm. The expansion operation may be performed using an interpolation algorithm, such as linear interpolation, quadratic interpolation or any other interpolation algorithm commonly known by persons of ordinary skill in the art.

At step 440, the compressed dose correction multipliers and the pattern configured for the backscattering effects are multiplied point by point and convolved with $X_b$ to generate the backscattering portion of the compressed dose correction multipliers. At step 450, the backscattering portion of the compressed dose correction multipliers is expanded to a common scale grid. In one embodiment, the common scale grid has a cell size of about 50 to about 200 nm. The expansion operation may be performed using an interpolation algorithm, such as linear interpolation, quadratic interpolation or any other interpolation algorithm commonly known by persons of ordinary skill in the art.

At step 460, the compressed dose correction multipliers and the pattern configured for the scattering effects of fast secondary electrons are multiplied point by point and convolved with $X_s$ to generate the scattering portion corresponding to the scattering effects of fast secondary electrons of the compressed dose correction multipliers. At step 455, the scattering portion corresponding to the scattering effects of fast secondary electrons of the compressed dose correction multipliers is expanded to a common scale grid. The expansion operation may be performed using an interpolation algorithm, such as linear interpolation, quadratic interpolation or any other interpolation algorithm commonly known by persons of ordinary skill in the art.

At step 470, the entire dose correction multipliers are computed according to Equation (1). Steps 420 through 470 are then repeated or iterated until the dose correction multipliers computed at step 470 converge. Upon convergence, the dose correction multipliers at the last iteration are sent to the flash generator (step 480). Referring back to FIG. 2, at step 230, the final dose correction multipliers are then used to modify a dose for generating a flash. In this manner, the final dose correction multipliers may be used to modulate the flash dwell time.

As mentioned above, Equation (1) contains the variable $\Theta$, which represents relative resist sensitivity, which may vary across the mask. Several factors contributing to variation in relative resist sensitivity include resist heating, map-type effects and time-dependent effects. Relative resist sensitivity may be represented as $\Theta=\Theta_h \times \Theta_m \times \Theta_t$, where $\Theta_h$ represents correction for resist heating, $\Theta_m$ represents correction for map-type effects, and $\Theta_t$ represents correction for time-dependent effects. $\Theta$ is a spatially varying quantity, which enters Equation (1) point-wise.

Resist sensitivity varies with temperature. Accordingly, correction for resist heating may be defined as a function of temperature, i.e., $\Theta_h=\Theta_h(T)$, where T represents temperature, which is a function of the writing history. If the flash-to-flash heating is ignored and only line-to-line heating is considered, T may be determined by $T=dP \otimes \Gamma$, where $\Gamma$ where is the thermal diffusion kernel converted to the spatial domain and may be a function of substrate material and stage speed. Correction for resist heating may also be a function of resist type and resist thickness, and as such, it may be determined experimentally, which may require tabular input.

Map-type effects may arise from non-uniformities in resist coating, resist development, and absorber etching. As such, correction for map-type effects is a function of space (X, Y), i.e., $\Theta_m=\Theta_m(X,Y)$. Correction for map-type effects may also be a function of process recipe, e.g., resist type, post exposure tool, etch tool and the like, and as such may be determined experimentally, which may require tabular input.

Correction for time-dependent effects may be defined as a function of time elapsed between the exposure of a flash and the post-exposure bake, at which time the resist chemistry is quenched. That is $\Theta_t=\Theta_t(t_{PEB}-t)$, where $t_{PEB}$ represents the post-exposure bake time and t represents the flash exposure time. In the simplest model, the post-exposure bake time is unknown. Thus, $\Theta_t$ may be approximated by a simple, linear function, $\Theta_t \approx \Theta_t(t')$, where t' represents the time elapsed since the first flash was exposed on the plate.

In this manner, any critical dimension effects that are dose-dependent may be corrected by modulating the dose according to the various embodiments described herein. As each flash is printed, a dose unique to that flash is selected to offset the critical dimension effects associated with that dose. By using embodiments of the invention, the impact of critical dimension effects on each flash may be predicted in advance and used to modify the dose accordingly.

While the foregoing is directed to embodiments of the present invention, other and further embodiments of the invention may be devised without departing from the basic scope thereof, and the scope thereof is determined by the claims that follow.

What is claimed is:

1. A method for generating a charged particle beam flash, comprising:
   computing an array of dose correction multipliers, based, at least in part, on a resist sensitivity correction factor backscattering and secondary electron scattering; and
   using the array of dose correction multipliers to modulate an exposure dose of the charged particle beam flash.

2. The method of claim 1, wherein the computing the array of dose correction multipliers comprises computing a fogging scattering portion of the array of dose correction multipliers.

3. The method of claim 2, wherein the fogging scattering portion of the array of dose correction multipliers is computed using a sample of a pattern.

4. The method of claim 2, wherein computing the fogging scattering portion of the array of dose correction multipliers comprises sampling a pattern to a first grid configured to take into account fogging scattering effects, to a second grid configured to take into account backscattering effects, and to a third grid configured to take into account scattering effects of fast secondary electrons.

5. The method of claim 4, wherein computing the fogging scattering portion of the array of dose correction multipliers further comprises:
   (a) scaling the array of dose correction multipliers comprising:
      (i) compressing the array of dose correction multipliers to dimensions allowing point-by-point multiplication with the first grid;
      (ii) compressing the array of dose correction multipliers to dimensions allowing point-by-point multiplication with the second grid; and
      (iii) compressing the array of dose correction multipliers to dimensions allowing point-by-point multiplication with the third grid:
   (b) generating a compressed fogging scattering portion of the array of dose correction multipliers by multiplying the array of dose correction multipliers compressed to dimensions allowing point-by-point multiplication with the first grid with the pattern sampled to the first grid and convolving the result with $X_f$ defined as $$X_f = \sum^{fogging} a_i G(\sigma_i),$$

where G represents Gaussian functions, $a_i$ represents weights of respective Gaussian functions, and $\sigma_i$ a represents widths of the Gaussian functions;

(c) interpolating the compressed fogging scattering portion of the array of dose correction multipliers to generate the fogging scattering portion of the array of dose correction multipliers;

(d) generating a compressed backscattering portion of the array of dose correction multipliers by multiplying the array of dose correction multipliers compressed to dimensions allowing point-by-point multiplication with the second grid with the pattern sampled to the second grid and convolving the result with $X_b$ defined as $$X_b = \sum^{backscatter} a_i G(\sigma_i);$$

(e) interpolating the compressed backscattering portion of the array of dose correction multipliers to generate the backscattering portion of the array of dose correction multipliers;

(f) generating a compressed scattering portion of the array of dose correction multipliers corresponding to the scattering effects of fast secondary electrons by multiplying the array of dose correction multipliers normalized to compressed to dimensions allowing point-by-point multiplication with the third grid with the pattern sampled to the third grid and convolving the result with $X_s$ defined as $$X_s = \sum^{fast\text{-}secondary} a_i G(\sigma_i);$$

(g) interpolating the compressed scattering portion of the array of dose correction multipliers corresponding to the scattering effects of fast secondary electrons to generate a scattering portion of the array of dose correction multipliers corresponding to the scattering effects of fast secondary electrons; and (h) computing the array of dose correction multipliers according to $d' = Ad/\Theta\{A_k d + 2(d_s P_s \otimes X_s) + 2(d_b P_b \otimes X_b) + 2(d_f P_f \otimes X_f)\}$, where A represents a sum of all coefficients in the Gaussian representation of the point spread function, d represents the dose correction multiplier, $A_k$ represents the weight of a proportion of energy deposition that does not scatter by fast secondary, backscatter, or fogging effects, $d_s P_s \otimes X_s$ represents the scattering portion of the array of dose correction multipliers corresponding to the scattering effects of fast secondary electrons, $d_b P_b \otimes X_b$ represents the backscattering portion of the array of dose correction multipliers, $d_f P_f \otimes X_f$ represents the fogging scattering portion of the array of dose correction multipliers, and $\Theta$ represents correction for the resist sensitivity.

6. The method of claim 5, wherein (a) through (h) are iterated until changes in the array of dose correction multipliers converge to predetermined a value.

7. The method of claim 6, wherein the compressed fogging scattering portion of the array of dose correction multipliers used to compute the last array of dose correction multipliers is saved at the point of convergence.

8. The method of claim 5, wherein the interpolating the compressed fogging scattering portion of the array of dose correction multipliers comprises interpolating the compressed fogging scattering portion of the array of dose correction multipliers to a common scale grid.

9. The method of claim 5, wherein the interpolating the compressed backscattering portion of the array of dose correction multipliers comprises interpolating the compressed backscattering portion of the array of dose correction multipliers to a common scale grid.

10. The method of claim 5, wherein the correction for the resist sensitivity comprises at least one of correction for resist heating, correction for map-type defects, and correction for time-dependent defects.

11. The method of claim 5, wherein computing the array of dose correction multipliers comprises sampling the pattern to the second grid and to the third grid.

12. The method of claim 5, wherein computing the array of dose correction multipliers further comprises:

(i) scaling the array of dose correction multipliers comprising:
  (i) compressing the array of dose correction multipliers to dimensions allowing point-by-point multiplication with the second grid; and
  (ii) compressing the array of dose correction multipliers to dimensions allowing point-by-point multiplication with the third grid;

(j) interpolating the saved compressed fogging scattering portion of the array of dose correction multipliers to generate the fogging scattering portion of the array of dose correction multipliers;

(k) generating a compressed backscattering portion of the array of dose correction multipliers by multiplying the array of dose correction multipliers compressed to dimensions allowing point-by-point multiplication with the second grid with the pattern sampled to the second grid and convolving the result with $X_b$ defined as, $$X_b = \sum^{backscatter} a_i G(\sigma_i);$$

(l) interpolating the compressed backscattering portion of the array of dose correction multipliers to generate a backscattering portion of the array of dose correction multipliers;

(m) generating a compressed scattering of fast secondary electrons portion of the array of dose correction multipliers by multiplying the array of dose correction multipliers compressed to dimensions allowing point-by-point multiplication with the third grid with the pattern sampled to the third grid and convolving the result with $X_s$ defined as $$X_s = \sum^{fast\text{-}secondary} a_i G(\sigma_i);$$

(n) interpolating the compressed scattering of fast secondary electrons portion of the array of dose correction multipliers to generate a scattering portion of the array of dose correction multipliers corresponding to the scattering effects of fast secondary electrons; and (o) computing the array of dose correction multipliers according to $d'=Ad/\Theta\{A_k d+2(d_s P_s \otimes X_s)+2(d_h P_h \otimes X_h)=2(d_h P_f \otimes X_f)\}$.

13. The method of claim 12, wherein (i) through (o) are iterated until changes in the array of dose correction multipliers converge to predetermined a value.

14. The method of claim 13, wherein the array of dose correction multipliers at the last iteration is used to generate the charged particle beam flash.

15. The method of claim 13, using the array of dose correction multipliers to generate the charged particle beam flash comprises sending the array of dose correction multipliers at the last iteration to a flash generator.

16. The method of claim 1, wherein computing the array of dose correction multipliers comprises computing a backscattering portion of the array of dose correction multipliers using a pattern sampled to take into account the backscattering effects.

17. The method of claim 1, wherein computing the array of dose correction multipliers comprises computing a scattering portion of the array of dose correction multipliers corresponding to the scattering effects of fast secondary electrons using a pattern sampled to take into account the scattering effects of fast secondary electrons.

* * * * *

UNITED STATES PATENT AND TRADEMARK OFFICE
CERTIFICATE OF CORRECTION

PATENT NO.         : 7,498,591 B2
APPLICATION NO. : 11/241792
DATED                 : March 3, 2009
INVENTOR(S)       : Lozes et al.

It is certified that error appears in the above-identified patent and that said Letters Patent is hereby corrected as shown below:

Title Page, Abstract (57):

Please delete: "A method for generating a flash. The method includes computing dose correction multipliers taking into account fogging scattering effects, backscattering effects and fast secondary scattering effects; and using the dose correction multipliers to generate the flash."

and

Please insert: --A method for generating a charged particle beam flash. The method includes computing an array of dose correction multipliers, based, at least in part, on a resist sensitivity correction factor; and using the array of dose correction multipliers to modulate an exposure dose of the charged particle beam flash.-- therefor;

In the Summary of the Invention:

Column 1, Lines 57-67, please delete: "Embodiments of the invention are generally directed to a method for generating a flash. The method includes computing a displacement vector to resist charging. The displacement vector is defined as $\vec{\delta}_r = dP \otimes \vec{K}$, where $\vec{\delta}_c$ represents the displacement vector, d represents dose correction multipliers, P represents pattern exposure data, $\otimes$ represents a mathematical convolution operation, and $\vec{K}$ represents a Poisson kernel converted to a spatial domain.

The method further includes using the displacement vector to modify the positioning of the flash."

and

Please insert: --Embodiments of the invention are generally directed to a method for generating a charged particle beam flash. The method includes computing an array of dose correction multipliers, based, at least in part, on a resist sensitivity correction factor, backscattering, and secondary electron scattering. The method further includes using the array of dose correction multipliers to modulate an exposure dose of the charged particle beam flash.-- therefor;

UNITED STATES PATENT AND TRADEMARK OFFICE
CERTIFICATE OF CORRECTION

PATENT NO. : 7,498,591 B2
APPLICATION NO. : 11/241792
DATED : March 3, 2009
INVENTOR(S) : Lozes et al.

It is certified that error appears in the above-identified patent and that said Letters Patent is hereby corrected as shown below:

In the Detailed Description:

Column 3, Lines 50-67, please delete: "At step 395, the entire dose correction multipliers are computed according to the following equation:

$$d' = Ad / \Theta\{A_k d + 2(d_s P_s \otimes X_s) + 2(d_b P_b \otimes X_b) + 2(d_f P_f \otimes X_f)\} \quad \text{(Equation 1)},$$

where A represents the sum of all coefficients in the Gaussian representation of the point spread function, d represents the dose correction multipliers, $A_k$ represents the weight of that proportion of the energy deposition that does not scatter by fast secondary, backscatter, or fogging effects, $d_s P_s \otimes X_s$ represents the fast secondary scatterring portion of the dose correction multipliers computed at step 385-390, $d_b P_b \otimes X_b$ represents the backscattering portion of the dose correction multipliers computed at steps 370-380, $d_f P_h \otimes X_f$ represents the fogging scattering portion of the dose multipliers computed at steps 350-360 and $\Theta$ represents correction for relative resist sensitivity, which will be described in the paragraphs below."

and

Please insert: --At step 370, the compressed dose correction multipliers and the pattern sample for the backscattering effects are multiplied point by point and convolved with $X_b$ to generate the backscattering portion (or term) of the compressed dose correction multipliers. $X_b$ is defined as $X_b = \sum^{backscatter} a_i G(\sigma_i)$. The backscattering portion of the compressed dose correction multipliers is also calculated over the entire mask. At step 380, the backscattering portion of the compressed dose correction multipliers is expanded to a common scale grid. In one embodiment, the common scale grid has a cell size of about 50 to about 200 nm. The expansion operation may be performed using an interpolation algorithm, such as linear interpolation, quadratic interpolation or any other interpolation algorithm commonly known by persons of ordinary skill in the art.-- therefor;

UNITED STATES PATENT AND TRADEMARK OFFICE
CERTIFICATE OF CORRECTION

PATENT NO. : 7,498,591 B2
APPLICATION NO. : 11/241792
DATED : March 3, 2009
INVENTOR(S) : Lozes et al.

It is certified that error appears in the above-identified patent and that said Letters Patent is hereby corrected as shown below:

Column 4, Line 36, please delete " $d_f P_h \otimes X_f$ " and insert -- $d_f P_f \otimes X_f$ -- therefor;

Column 4, Line 63, please delete "Of" and insert --of-- therefor;

In the Claims:

Column 6, Claim 1, Line 31, insert --,-- after factor;

Column 6, Claim 1, Line 32, insert --,-- after backscattering;

Column 7, Claim 5, Line 32, please delete "normalized to".

Signed and Sealed this

Twenty-sixth Day of May, 2009

JOHN DOLL
*Acting Director of the United States Patent and Trademark Office*